(12) United States Patent
Valeri et al.

(10) Patent No.: US 11,588,459 B1
(45) Date of Patent: Feb. 21, 2023

(54) VEHICLE AUDIO CONTROL BASED ON SENSED PHYSICAL CHANGES IN VEHICLE CONFIGURATION

(71) Applicant: GM Global Technology Operations LLC, Detroit, MI (US)

(72) Inventors: Frank C. Valeri, Novi, MI (US); Connor Schuman, Fayetteville, AR (US); Richard A. Close, Farmington Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/392,563

(22) Filed: Aug. 3, 2021

(51) Int. Cl.
*H03G 3/32* (2006.01)
*H04R 5/04* (2006.01)
*H04R 5/02* (2006.01)

(52) U.S. Cl.
CPC .............. *H03G 3/32* (2013.01); *H04R 5/02* (2013.01); *H04R 5/04* (2013.01); *H04R 2410/07* (2013.01); *H04R 2430/01* (2013.01); *H04R 2499/13* (2013.01)

(58) Field of Classification Search
CPC ........ H04R 5/02; H04R 5/04; H04R 2410/07; H04R 2430/07; H04R 2499/13; H03G 3/32

USPC ......... 381/86, 104–109, 103, 302, 71.4, 101
See application file for complete search history.

(56) References Cited

U.S. PATENT DOCUMENTS

| | | | | |
|---|---|---|---|---|
| 7,483,539 B2* | 1/2009 | Stark | ...................... | H04B 1/082 381/86 |
| 7,979,147 B1* | 7/2011 | Dunn | ..................... | G10K 15/02 381/61 |
| 9,141,187 B2* | 9/2015 | Davis | ........................ | G06F 3/01 |
| 11,170,751 B1* | 11/2021 | Lee | ..................... | G10K 11/1783 |
| 11,299,124 B2* | 4/2022 | Caron | ................... | G10K 11/178 |
| 11,330,354 B2* | 5/2022 | Degner | ................. | H04R 5/033 |
| 11,345,353 B2* | 5/2022 | Luo | ......................... | B60R 21/01 |
| 2014/0016797 A1* | 1/2014 | Phagoo | ................... | H04S 7/301 381/86 |
| 2021/0225349 A1* | 7/2021 | Seffernick | ............ | G10K 11/178 |

* cited by examiner

*Primary Examiner* — Disler Paul
(74) *Attorney, Agent, or Firm* — Cantor Colburn LLP

(57) ABSTRACT

An audio control system for a vehicle includes a processor, a non-volatile memory module having stored therein instructions for controlling one or more vehicle audio components, a sensor operable to detect a change in vehicle configuration, and a control module operable to adjust a vehicle audio component based on the change in vehicle configuration according to instructions stored in the non-volatile memory module.

17 Claims, 2 Drawing Sheets

VEHICLE AUDIO CONTROL BASED ON SENSED PHYSICAL CHANGES IN VEHICLE CONFIGURATION

INTRODUCTION

The subject disclosure relates to vehicles and, more particularly, to a vehicle having a system for detecting physical changes in vehicle configuration and adjusting vehicle audio based on the sensed physical changes, in accordance with a non-limiting example.

Many vehicles include moveable and/or removable panels, surfaces, and the like. For example, most vehicles produced today include a sun and/or moon roof that can be opened to expose a passenger compartment to ambient. Other vehicles may include removeable doors, windows, roof panels, or other panels that, when removed, effectively change an internal volume of the passenger compartment. The change in internal volume may affect how audio is perceived by vehicle occupants.

Many vehicles provide a user with audio controls. However, simply adjusting balance, treble, bass, and the like will not provide a desired change in audio output that can accommodate the change in internal volume. Further, sound system adjustments often do not affect vehicle notifications, chimes, and the like. Accordingly, it is desirable to provide a system for detecting a change in a physical configuration of a vehicle and adjusting audio controls accordingly.

SUMMARY

Disclosed is an audio control system for a vehicle including a processor, a non-volatile memory module having stored therein instructions for controlling one or more vehicle audio components, a sensor operable to detect a change in vehicle configuration, and a control module operable to adjust a vehicle audio component based on the change in vehicle configuration according to instructions stored in the non-volatile memory module.

In addition to one or more of the features described above or below, or as an alternative, further embodiments could include wherein the sensor includes at least one primary sensor and at least one secondary sensor.

In addition to one or more of the features described above or below, or as an alternative, further embodiments could include wherein the at least one primary sensor includes a first primary sensor and a second primary sensor that is distinct from the first primary sensor.

In addition to one or more of the features described above or below, or as an alternative, further embodiments could include wherein the first primary sensor comprises a microphone and the second primary sensor comprises a camera.

In addition to one or more of the features described above or below, or as an alternative, further embodiments could include wherein the at least one secondary sensor comprises a first secondary sensor and a second secondary sensor that is distinct from the first secondary sensor.

In addition to one or more of the features described above or below, or as an alternative, further embodiments could include wherein the first secondary sensor comprises a light sensor and the second secondary sensor comprises a proximity sensor.

In addition to one or more of the features described above or below, or as an alternative, further embodiments could include wherein the sensor is operable to detect a change in passenger compartment volume.

In addition to one or more of the features described above or below, or as an alternative, further embodiments could include wherein the change in passenger compartment volume includes exposing an aperture in a body of the vehicle.

Also disclosed is a vehicle including a body and a passenger compartment defined by the body. The passenger compartment including one or more selectively exposable apertures. At least one audio system is arranged in the passenger compartment, and an audio control system is operable to adjust parameters of the at least one audio system based on a change in configuration of the one or more selectively exposable apertures. The audio control system includes a processor, a non-volatile memory module having stored therein instructions for controlling one or more vehicle audio components, a sensor operable to detect a change in vehicle configuration, and a control module operable to adjust a vehicle audio component based on the change in vehicle configuration according to instructions stored in the non-volatile memory module.

In addition to one or more of the features described above or below, or as an alternative, further embodiments could include wherein the sensor includes at least one primary sensor and at least one secondary sensor.

In addition to one or more of the features described above or below, or as an alternative, further embodiments could include wherein the at least one primary sensor includes a first primary sensor and a second primary sensor that is distinct from the first primary sensor.

In addition to one or more of the features described above or below, or as an alternative, further embodiments could include wherein the first primary sensor comprises a microphone and the second primary sensor comprises a camera.

In addition to one or more of the features described above or below, or as an alternative, further embodiments could include wherein the at least one secondary sensor comprises a first secondary sensor and a second secondary sensor that is distinct from the first secondary sensor.

In addition to one or more of the features described above or below, or as an alternative, further embodiments could include wherein the first secondary sensor comprises a light sensor and the second secondary sensor comprises a proximity sensor.

In addition to one or more of the features described above or below, or as an alternative, further embodiments could include wherein the sensor is operable to detect a change in passenger compartment volume.

In addition to one or more of the features described above or below, or as an alternative, further embodiments could include wherein the at least one audio system includes one of an infotainment system, a noise cancellation system, a sound enhancement system, and a vehicle warning system.

Further disclosed is a method of controlling a vehicle audio system including detecting a physical change in vehicle configuration with at least one sensor, and adjusting the vehicle audio system based on the physical change in vehicle configuration.

In addition to one or more of the features described above or below, or as an alternative, further embodiments could include confirming the physical change in vehicle configuration with at least one another sensor.

In addition to one or more of the features described above or below, or as an alternative, further embodiments could include wherein detecting the physical change in vehicle configuration includes determining that a selectively exposable aperture has been exposed.

In addition to one or more of the features described above or below, or as an alternative, further embodiments could include wherein adjusting the vehicle audio system includes changing an audio gain in one of an infotainment system output and a vehicle warning system output.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
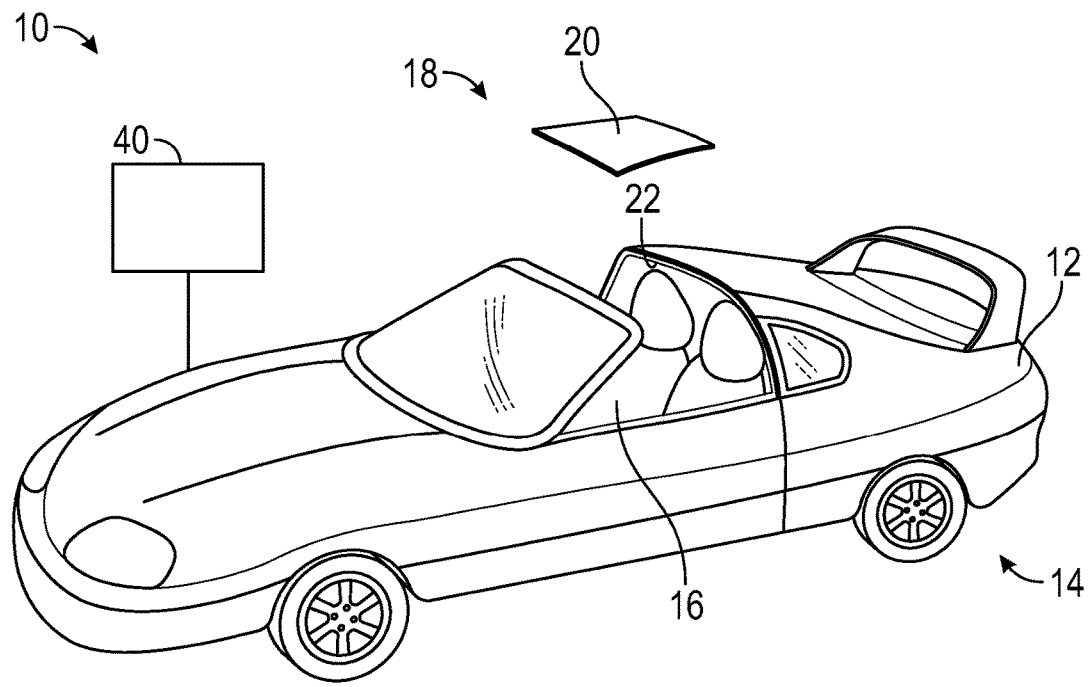
FIG. 1 depicts a vehicle including a system for detecting physical changes in vehicle configuration and adjusting vehicle audio based on the sensed physical change(s), in accordance with a non-limiting example.

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

A vehicle, in accordance with a non-limiting example, is indicated generally at 10 in FIG. 1. Vehicle 10 includes a body 12 supported by a number of wheels indicated generally at 14. Body 12 includes a passenger compartment 16 having one or more reconfigurable surfaces, one of which is indicated at 18. Reconfigurable surface 18, in a non-limiting example, is shown in the form of a removable Targa top 20 that selectively extends over an aperture 22 in a roof of body 12. Vehicle 10 also includes audio components indicated generally at 28 in FIG. 2. Audio components 28 may include an infotainment system 30, a vehicle warning system 34, a noise cancellation system 36, and a sound enhancement system 38. Infotainment system 30 may simply provide music and news from AM and/or FM sources or may include a satellite connection that provides navigation as well as entertainment options. Infotainment system 30 may also allow a user to have a hands-free phone option.

At this point, it should be understood that reconfigurable surface(s) 18 can take on a wide variety of forms including metal surfaces, plastic surfaces, glass surfaces, cloth surfaces and the like. Reconfigurable surface(s) 18 can include windows, sun roofs, moon roofs, convertible tops, T-tops, Targa-top(s), changing between passenger and truck configurations and the like. Reconfigurable surface(s) 18 may also take the form of sliding panels, pivoting panels, removeable and/or repositionable interior panels, and removeable and/or repositionable exterior panels. Reconfigurable, should be understood as a change in the surface position by exposing and/or covering an aperture thereby changing a defined volume of passenger compartment 16 and/or directly connecting or isolating passenger compartment 16 and ambient.

Figure 2:
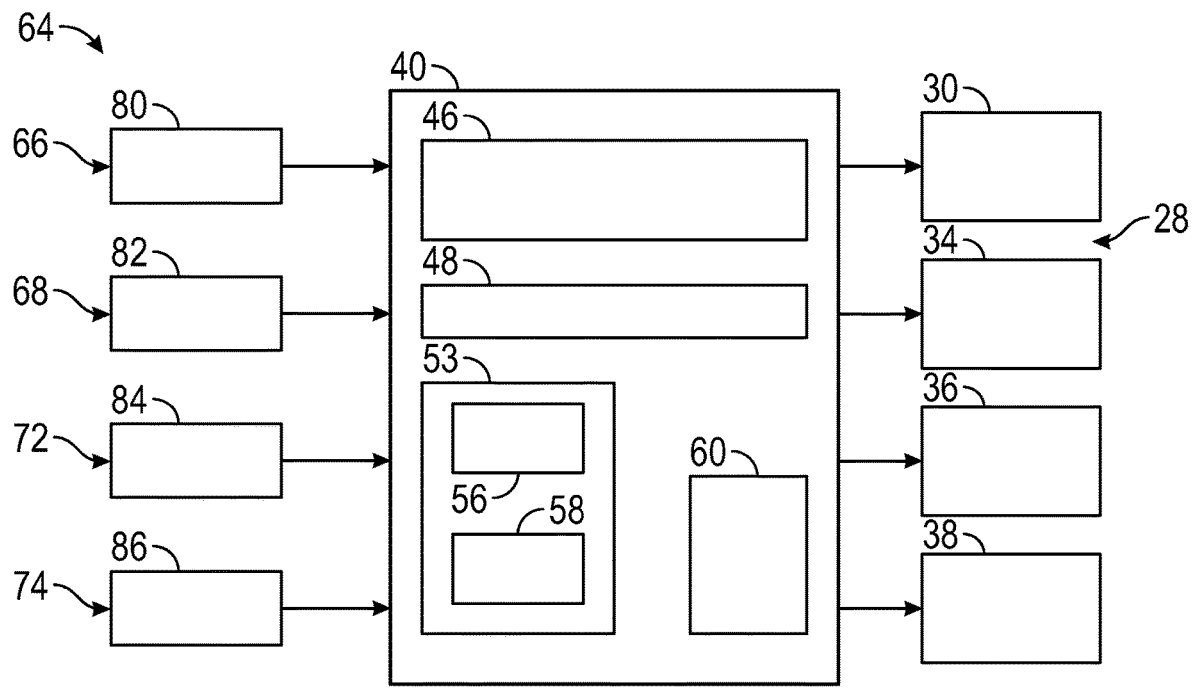
FIG. 2 is a schematic view of a control system for detecting physical changes in vehicle configuration and adjusting vehicle audio based on the sensed physical change (s), in accordance with a non-limiting example.

Referring to FIG. 2 and with continued reference to FIG. 1, vehicle 10 includes an audio control system 40 that selectively controls audio components 28 in response to a change in configuration of passenger compartment 16. In a non-limiting example, audio components may include vehicle infotainment systems, warning buzzers or chimes, noise cancellation systems/sound enhancement systems, sound systems and the like as discussed herein. Thus, the term "audio" should be understood to encompass any sound output in passenger compartment 16. Audio control system 40 includes a processor module 46, such as a central processor unit (CPU) coupled to a non-volatile memory module 48 having stored thereon instructions for adjusting audio components 28 based on physical configuration changes to vehicle 10. Audio control system 40 further includes a control module 53 that may include an infotainment control element 56 and a vehicle warning control unit 58 as well as any other controls needed to affect changes to audio components 28. Further, audio control system 40 may include a training module 60 that allows a user to train control module 53 on how to recognize a change in physical configuration and how to adjust audio components 28 accordingly.

In a non-limiting example, audio control system 40 is coupled to a vehicle sensor system 64. Sensor system 64 includes a first primary sensor 66 and a second primary sensor 68. Sensor system 64 also includes a first secondary sensor 72 and a second secondary sensor 74. In a non-limiting embodiment, first primary sensor 66 may take the form of a microphone 80 and second primary sensor 68 may take the form of a camera(s) 82. First secondary sensor 72 may take the form of a light sensor 84 and second secondary sensor 74 may take the form of a proximity sensor 86. At this point, it should be understood that the number and type of sensors may vary and could include infra-red sensors, pressure sensors, temperature sensors, motion sensors and the like.

Figure 3:
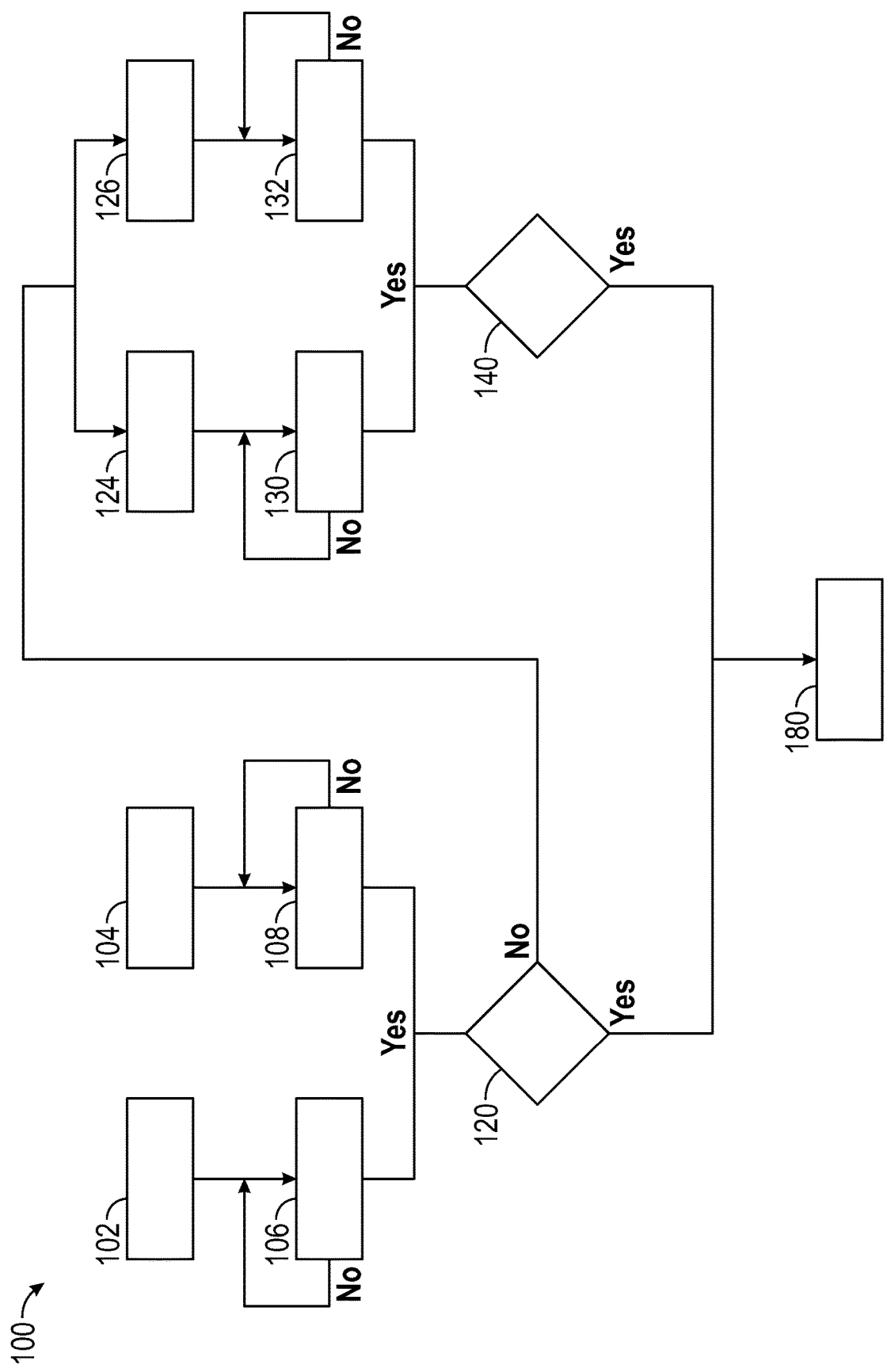
FIG. 3 depicts a block diagram illustrating a method of detecting physical changes in vehicle configuration and adjusting vehicle audio based on the sensed physical change (s), in accordance with a non-limiting example.

Reference will now follow to FIG. 3 in describing a method 100 of controlling audio components 28 in response to a physical configuration change in vehicle 10. In block 102, processor module 46 communicates with first primary sensor 66 to determine if a change in configuration is detected. The change in configuration may be determined based on changes in sound perceived by microphone 80. The changes in sound may include changes in volume, wind noise, or a change in perceived sound quality. The change in sound quality may represent a change in magnitude of a pre-selected frequency band.

Similarly, in block 104, processor module 46 communicates with second primary sensor 68 to determine if a change in configuration is detected. The change in configuration identified by second primary sensor 68 may take the form of images capture by camera 80. In a non-limiting example, the images may take on a variety of forms including the existence and/or absence of light, objects, quick response (QR) codes and the like. Any change in configuration sensed at first primary sensor 66 is passed to block 106 and any change in configuration sensed at second primary sensor 68 is passed to block 108. In block 120, a determination is made whether both blocks 106 and 108 indicate a change in configuration.

If only one of blocks 106, 108 indicates a sensed change, processor module 46 determines whether a confirmation of the sensed change is needed. Processor module 46 may confirm the detected change by communicating with first secondary sensor 72 in block 124 and second secondary sensor 74 in block 126. The change in configuration may be determined from first secondary sensor 72 based on, for example, a change in light quality and a change in configuration from second secondary sensor 74 may be determined based on an input from a proximity sensor that detects the presence or absence of a panel. Any change in configuration sensed from first secondary sensor 72 is passed to block 130 and any change in configuration sensed at second secondary sensor 74 is passed to block 132. In block 140, a determination is made whether the configuration change is confirmed in either block 130 or block 132.

If both of blocks 106 and 108 indicate a configuration change, processor module 48 may adjust audio components based on inputs from control module 53 and instructions in non-volatile memory module 48 in block 180. For example, processor module 46 may adjust an audio gain of an output from infotainment system 34 and/or vehicle warming system 34 or any other audio system 28. If only one of blocks 106 and 108 indicates a change, and that change indication possesses a selected confidence level, processor module will adjust audio components 28 in block 180. For example, if microphone 80 detects an unambiguous change in the specific frequency band, audio components 28 may be adjusted in block 180. However, if only one of blocks 106, 108 indicates a sensed configuration change, and that sensed change is below the selected confidence level, block 180 will adjust audio components 28 if the change is confirmed in either block 130 or block 132.

At this point, it should be understood that non-limiting examples describe a system that adjusts audio output in response to a physical change in vehicle configuration. For example, the change in vehicle configuration may represent a change from the defined volume of a passenger compartment to an undefined volume through exposure to ambient by removing, opening, or repositioning vehicle surfaces and/or panels so as to impact how audio is perceived. The change in configuration may also represent an increase and/or decrease in the defined volume of the passenger compartment through repositioning internal panels or surfaces. The controller, in accordance with non-limiting examples, adjusts various attributes of the audio output to promote a more clear perception by vehicle occupants.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. An audio control system for a vehicle comprising:
   a processor;
   a non-volatile memory module having stored therein instructions for controlling one or more vehicle audio components;
   a plurality of sensors operable to detect a physical change in vehicle configuration, the plurality of sensors including at least one primary sensor and at least one secondary sensor, the at least one primary sensor including one of a microphone and a camera and the at least one secondary sensor including at least one of a light sensor and a proximity sensor; and
   a control module operable to adjust a vehicle audio component based on the physical change in vehicle configuration according to instructions stored in the non-volatile memory module, wherein the control module is operable to adjust the vehicle audio component based on a physical change detected by one of the at least one primary sensor and the at least one secondary sensor and confirmed by the other of the at least one primary sensor and at least one secondary sensor.

2. The audio control system according to claim 1, wherein the at least one primary sensor includes a first primary sensor and a second primary sensor that is distinct from the first primary sensor.

3. The audio control system according to claim 2, wherein the first primary sensor comprises a microphone and the second primary sensor comprises a camera.

4. The audio control system according to claim 1, wherein the at least one secondary sensor comprises a first secondary sensor and a second secondary sensor that is distinct from the first secondary sensor.

5. The audio control system according to claim 4, wherein the first secondary sensor comprises a light sensor and the second secondary sensor comprises a proximity sensor.

6. The audio control system according to claim 1, wherein one of the plurality of sensors is operable to detect a change in passenger compartment volume.

7. The audio control system according to claim 6, wherein the change in passenger compartment volume includes exposing an aperture in a body of the vehicle.

8. A vehicle comprising:
   a body;
   a passenger compartment defined by the body, the passenger compartment including one or more reconfigurable surfaces;
   at least one audio system arranged in the passenger compartment; and
   an audio control system operable to adjust parameters of the at least one audio system based on a change in configuration of the one or more reconfigurable surfaces, the audio control system comprising:
   a processor;
   a non-volatile memory module having stored therein instructions for controlling one or more vehicle audio components;
   a plurality of sensors operable to detect a physical change in vehicle configuration based on the change of the one or more reconfigurable surfaces, the plurality of sensors including at least one primary sensor and at least one secondary sensor, the at least one primary sensor including one of a microphone and a camera and the at least one secondary sensor including at least one of a light sensor and a proximity sensor; and
   a control module operable to adjust a vehicle audio component based on the change in vehicle configuration according to instructions stored in the non-volatile memory module, wherein the control module is operable to adjust the vehicle audio component based on a physical change detected by one of the at least one primary sensor and the at least one secondary sensor and confirmed by the other of the at least one primary sensor and at least one secondary sensor.

9. The vehicle according to claim 8, wherein the at least one primary sensor includes a first primary sensor and a second primary sensor that is distinct from the first primary sensor.

10. The vehicle according to claim 9, wherein the first primary sensor comprises a microphone and the second primary sensor comprises a camera.

11. The vehicle according to claim 8, wherein the at least one secondary sensor comprises a first secondary sensor and a second secondary sensor that is distinct from the first secondary sensor.

12. The vehicle according to claim 11, wherein the first secondary sensor comprises a light sensor and the second secondary sensor comprises a proximity sensor.

13. The vehicle according to claim 8, wherein one of the plurality of sensors is operable to detect a change in passenger compartment volume.

14. The vehicle according to claim 8, wherein the at least one audio system includes one of an infotainment system, a noise cancellation system, a sound enhancement system, and a vehicle warning system.

15. A method of controlling a vehicle audio system comprising:
   detecting a physical change in vehicle configuration with at least one primary sensor including one of a microphone and a camera;
   determining whether a confirmation of the change in configuration is needed;
   confirming the change in configuration with at least one secondary sensor including one of a light sensor and a proximity sensor if the confirmation of the change in configuration is needed; and
   adjusting the vehicle audio system based on the physical change in vehicle configuration.

16. The method of claim 15, wherein detecting the physical change in vehicle configuration includes determining that a reconfigurable surfaces has been reconfigured.

17. The method of claim 15, wherein adjusting the vehicle audio system includes changing an audio gain in one of an infotainment system output and a vehicle warning system output.

* * * * *